(12) United States Patent
Trioux et al.

(10) Patent No.: US 10,312,431 B2
(45) Date of Patent: Jun. 4, 2019

(54) METHOD OF MANUFACTURING BISTABLE STRIPS HAVING DIFFERENT CURVATURES

(71) Applicants: STMicroelectronics SA, Montrouge (FR); STMicroelectronics (Crolles 2) SAS, Crolles (FR)

(72) Inventors: Emilie Trioux, Preverenges (CH); Pascal Ancey, Revel (FR); Stephane Monfray, Eybens (FR); Thomas Skotnicki, Crolles-Monfort (FR); Skandar Basrour, Grenoble (FR); Paul Muralt, La Sarraz (CH)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 938 days.

(21) Appl. No.: 14/634,454

(22) Filed: Feb. 27, 2015

(65) Prior Publication Data

US 2015/0255705 A1 Sep. 10, 2015

(30) Foreign Application Priority Data

Mar. 6, 2014 (FR) ..................................... 14 51833

(51) Int. Cl.
*H01L 41/27* (2013.01)
*C23C 4/134* (2016.01)
(Continued)

(52) U.S. Cl.
CPC ................ *H01L 41/27* (2013.01); *C23C 4/10* (2013.01); *C23C 4/134* (2016.01); *C23C 10/12* (2013.01);
(Continued)

(58) Field of Classification Search
CPC . H01L 41/0805; H01L 41/0815; H01L 41/27; H01L 41/33; F03G 7/06;
(Continued)

(56) References Cited

U.S. PATENT DOCUMENTS 4,083,220 A * 4/1978 Kobayashi ................ C22F 1/00
148/577
6,280,802 B1 * 8/2001 Akedo .................... C23C 4/134
427/180

(Continued)

FOREIGN PATENT DOCUMENTS

FR 2988911 A1 10/2013
JP 02211121 A * 8/1990
(Continued)

OTHER PUBLICATIONS

Machine Translation of French Patent Document FR 2 988 911, Aug. 2018.*
(Continued)

*Primary Examiner* — A. Dexter Tugbang
(74) *Attorney, Agent, or Firm* — Seed IP Law Group LLP

(57) ABSTRACT

A method of manufacturing bistable strips having different curvatures, each strip including a plurality of portion of layers of materials, wherein at least one specific layer portion is deposited by a plasma spraying method in conditions different for each of the strips.

9 Claims, 6 Drawing Sheets

(51) Int. Cl.
*H01L 41/08* (2006.01)
*F03G 7/06* (2006.01)
*C23C 4/10* (2016.01)
*C23C 10/12* (2006.01)
*H01L 41/33* (2013.01)
*C22F 1/00* (2006.01)
*B32B 15/01* (2006.01)

(52) U.S. Cl.
CPC ............ *F03G 7/06* (2013.01); *H01L 41/0805* (2013.01); *H01L 41/0815* (2013.01); *H01L 41/33* (2013.01); *B32B 15/01* (2013.01); *C22F 1/00* (2013.01); *Y10T 29/42* (2015.01); *Y10T 29/49005* (2015.01); *Y10T 29/49124* (2015.01)

(58) Field of Classification Search
CPC .. C23C 4/10; C23C 4/12; C23C 4/134; Y10T 29/42; Y10T 29/49005; Y10T 29/49124; B32B 15/01; C22F 1/00
See application file for complete search history.

(56) References Cited

U.S. PATENT DOCUMENTS

| | | | | |
|---|---|---|---|---|
| 6,327,760 | B1* | 12/2001 | Yun | ............ Y10T 29/42 29/25.35 |
| 6,675,450 | B1* | 1/2004 | Fetter | ............ Y10T 29/42 216/13 |
| 6,866,730 | B2* | 3/2005 | Cheng | ............ B32B 15/01 148/402 |
| 2002/0015259 | A1 | 2/2002 | Nishihara | |
| 2006/0033595 | A1 | 2/2006 | Nagao et al. | |
| 2006/0099440 | A1* | 5/2006 | Sahoo | ............ C23C 4/134 428/632 |
| 2010/0320871 | A1 | 12/2010 | Suenaga et al. | |
| 2012/0319533 | A1* | 12/2012 | Kubota | ............ Y10T 29/42 310/357 |
| 2013/0241939 | A1* | 9/2013 | Lasiter | ............ Y10T 29/42 345/501 |
| 2013/0257219 | A1 | 10/2013 | Monfray et al. | |
| 2013/0280549 | A1 | 10/2013 | Monfray et al. | |

FOREIGN PATENT DOCUMENTS

| | | |
|---|---|---|
| WO | 94/19834 A1 | 9/1994 |
| WO | 98/11586 A1 | 3/1998 |
| WO | 2008/084578 A1 | 7/2008 |

OTHER PUBLICATIONS

Dubois et al., "Stress and piezoelectric properties of aluminum nitride thin films deposited onto metal electrodes by pulsed direct current reactive sputtering," *Journal of Applied Physics* 89(11):6389-6395, Jun. 1, 2001.

Felmetsger et al., "Stress Control in AlN and Mo Films for Electro-Acoustic Devices," 2008 IEEE International Frequency Control Symposium, Honolulu, HI, May 19-21, 2008, pp. 629-633.

Hodge et al., "Stresses in Thin Film Metallization," *IEEE Transactions on Components, Packaging, and Manufacturing Technology—Part A* 20(2):241-250, Jun. 1997.

* cited by examiner

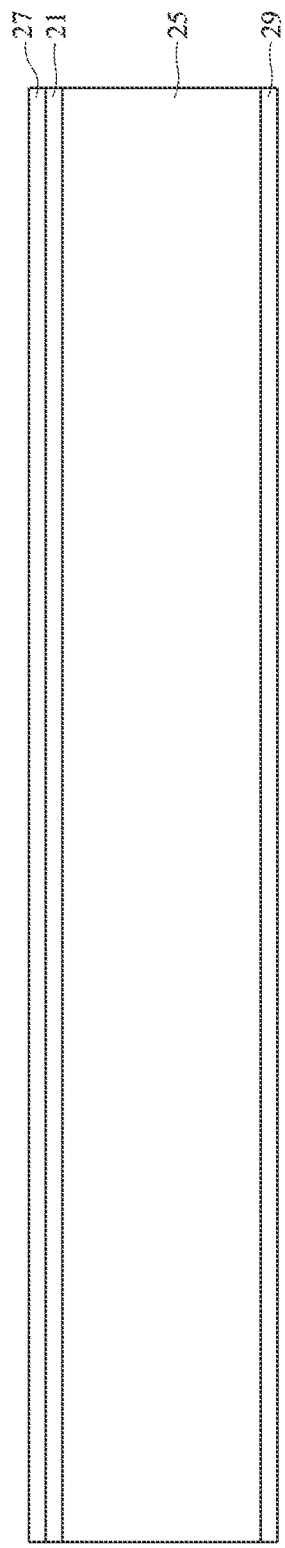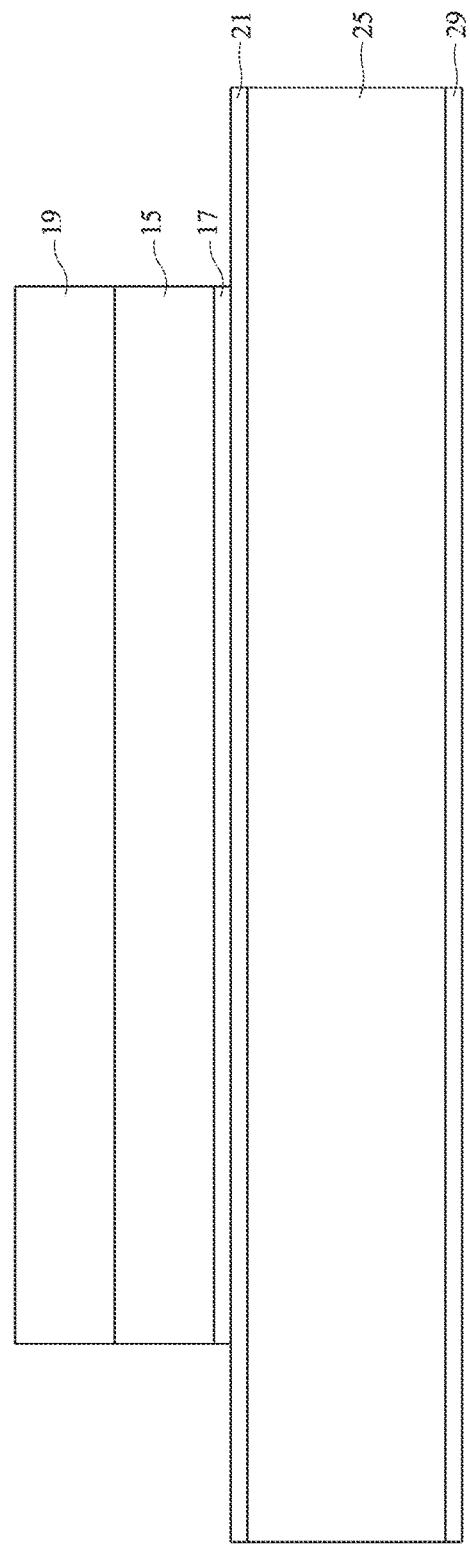

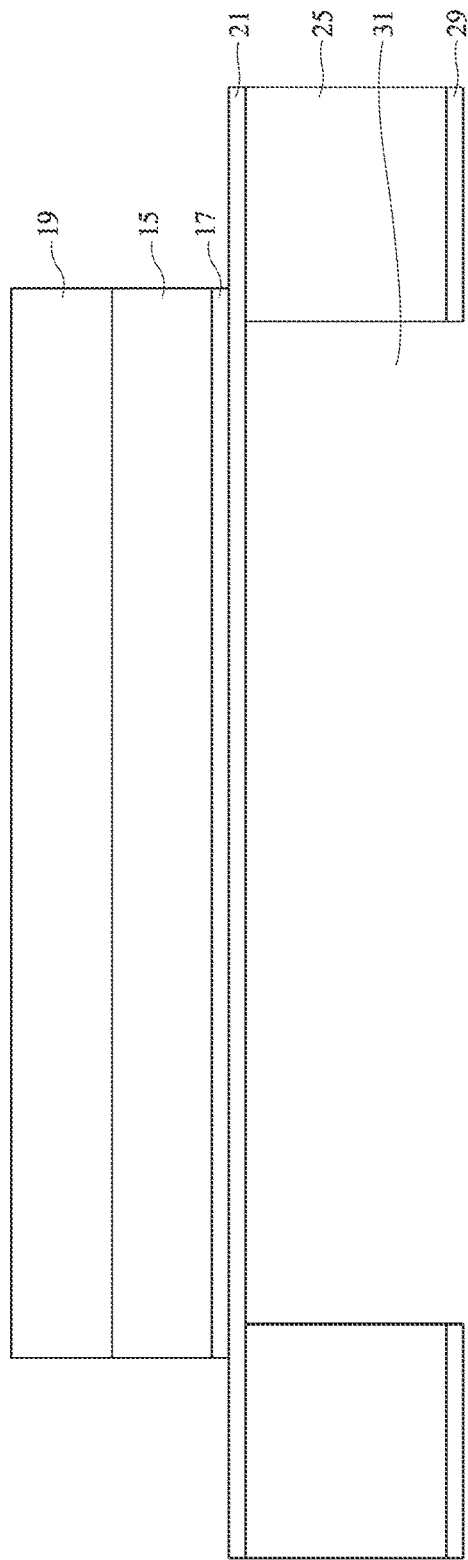

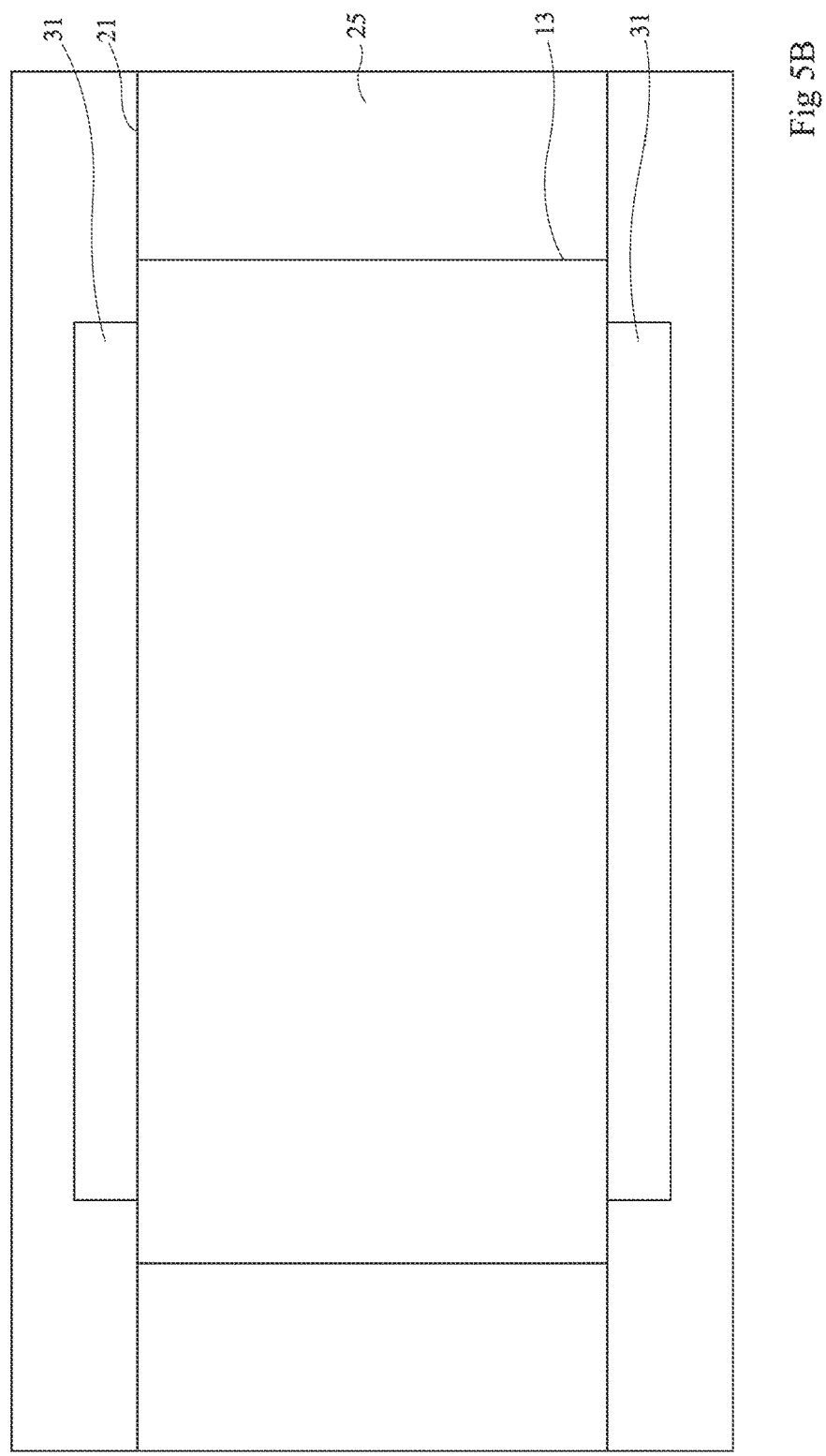

METHOD OF MANUFACTURING BISTABLE STRIPS HAVING DIFFERENT CURVATURES

BACKGROUND

Technical Field

The present disclosure relates to a method of manufacturing bistable strips having different curvatures.

Discussion of the Related Art

FIG. 1 corresponds to FIG. 2D of French patent application 2988911 filed on Apr. 3, 2012 (B11532), also published in 2013/0280549, which is hereby incorporated by reference in its entirety. FIG. 1 is a cross-section view of a curved bimetal strip at a step of its manufacturing. On a substrate 1, for example, a silicon substrate, blocks 3 are formed, having layers of different materials, for example, metallic materials 5 and 7 forming a bimetal, deposited thereon. Bimetal portions, corresponding to portions of layers 5 and 7 resting on blocks 3, are then cut to form the desired curved strips. Typically, the blocks 3 are removed.

Such a manufacturing method comprises two steps. In a first step, blocks defining the curvature of the curved strips are formed and in a second step, the layers of materials forming the bimetal are deposited.

The block manufacturing method does not enable to accurately control the block curvature. Further, manufacturing batches containing a plurality of bimetals with different bimetal curvatures from one batch to another is difficult.

BRIEF SUMMARY

It would be desirable to form curved strips with as few steps as possible and while accurately controlling the curvature of the curved strips.

Thus, an embodiment provides a method of manufacturing bistable strips having different curvatures, each strip comprising a plurality of portions of layers of materials, wherein at least one specific layer portion is deposited by a plasma spraying method in conditions different for each of the strips.

According to an embodiment, said different conditions comprise one and/or the other of the following conditions: applied RF power, power and frequency of a pulsed DC generator, temperature and/or biasing of a substrate holder.

According to an embodiment, each strip comprises a first portion of a layer of a first material; a second portion of a layer of a second conductive material; a third portion of a layer of a third piezoelectric material; and a fourth portion of a layer of a fourth conductive material.

According to an embodiment, the first and third materials are identical.

According to an embodiment, the first and third materials are aluminum nitride, the second conductive material is platinum, and the fourth conductive material is aluminum.

According to an embodiment, the first layer portion has a thickness in the range from 10 to 500 nm, the second layer portion has a thickness in the range from 10 to 500 nm, the third and fourth layer portions have thicknesses in the range from 1 to 10 µm.

According to an embodiment, said specific layer portion is the first portion of a layer of material.

According to an embodiment, the layers of materials are deposited on a silicon wafer open in front of the strip.

According to an embodiment, the second layer portion has a strain close to zero and the third and fourth layer portions have equal and opposite strains.

An embodiment provides a bistable piezoelectric strip comprising a portion of a layer of a first piezoelectric material arranged between first and second conductive material layer portions, further comprising a portion of a layer of a strained material arranged on one side of the strip.

According to an embodiment, the strained material is a second piezoelectric material.

According to an embodiment, the first and second piezoelectric materials are identical.

According to an embodiment, the first and second piezoelectric materials are aluminum nitride.

According to an embodiment, the first conductive material is platinum and the second conductive material is aluminum.

According to an embodiment, the strained material layer portion has a thickness in the range from 10 to 500 nm, the first conductive material layer portion has a thickness in the range from 10 to 500 nm, the second conductive material portion and the portion of a layer of a first piezoelectric material have thicknesses in the range from 1 to 10 µm.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIGS. 3, 4, and 5A are cross-section views of successive steps of manufacturing a bistable strip of the type in FIGS. 2A and 2B;

FIG. 5B is a top view of FIG. 5A;

For clarity, the same elements have been designated with the same reference numerals in the various drawings and, further, the various drawings are not to scale.

DETAILED DESCRIPTION

Figure 1:
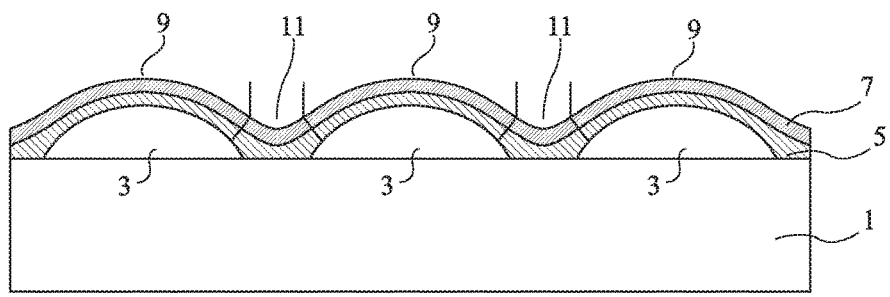
FIG. 1, previously described, shows in cross-section view a step of a method of manufacturing such a curved bimetal strip.
Figure 2A:
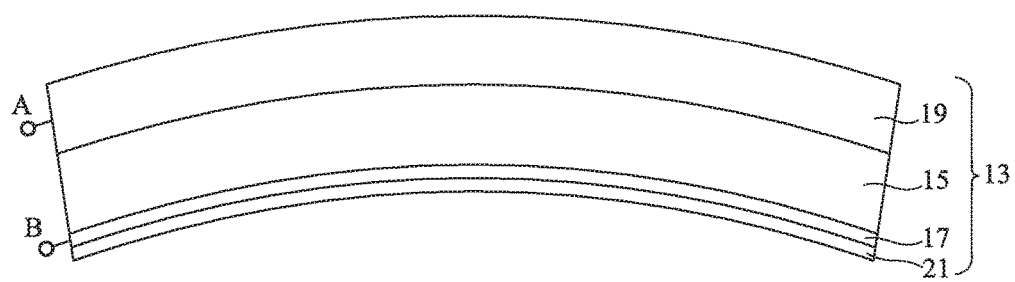
FIGS. 2A and 2B are cross-section views illustrating a bistable strip in two operating states.

FIG. 2A is a cross-section view of an example of bistable piezoelectric strip 13 in a first state. Strip 13 comprises a piezoelectric layer portion 15 having its rear surface coated with a thin metallic layer portion 17 and having its front surface coated with a metallic layer portion 19. Further, layer 17 is coated with a layer portion 21. Terminals A and B are respectively connected to metal layer portions 17 and 19. Bistable strip 13 is manufactured so that the assembly of layer portions 15, 17, and 19 has a strain close to zero and so that layer portion 21 is highly strained. Due to the high strain of layer portion 21, the strip takes a curved shape, for example, with an upward-facing convexity, as shown. Thus, layer 21 may be made of any material capable of being deposited in conditions creating a high strain therein. It will be seen hereafter that layer portion 21 may advantageously be made of the same material as piezoelectric layer 15, which simplifies the strip manufacturing.

Figure 2B:
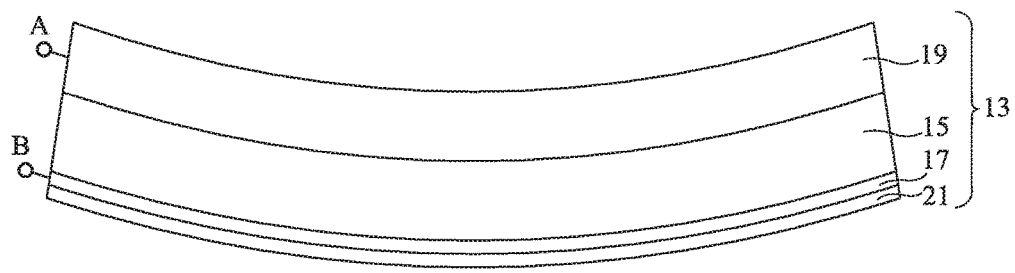

FIG. 2B is a cross-section view of strip 13 in a second state. As in any bistable strip, layer portions 15 and 19 have different thermal expansion coefficients which make bistable strip 13 change shape, for example, from a curved shape having an upward-facing convexity to a curved shape having a downward-facing convexity, when a temperature threshold is reached. The bistable strip deforms when a temperature threshold which is determined, among others, by the initial curvature of the strip, is passed. Strained layer portion 21 imposes the initial strip curvature, thus determining the temperature threshold for which the strip deforms. During the strip deformation, an electric potential is created and recovered on terminals A and B. Contact A may also be located on metal strip 17, as will be specified hereafter in relation with FIGS. 6A and 6B.

FIGS. 3, 4, and 5A are cross-section views illustrating successive steps of manufacturing of a bistable strip 13 of the type in FIGS. 2A and 2B. FIG. 5B is a top view corresponding to the cross-section view of FIG. 5A.

At the step illustrated in FIG. 3, a thin layer corresponding to the above-mentioned layer portion 21 has been deposited on a substrate 25 and has then been coated with a thin metal strip 27, for example, platinum. Substrate 25 for example is a silicon wafer having its rear surface coated with a silicon oxide layer 29.

At the step illustrated in FIG. 4, a piezoelectric layer, for example, aluminum nitride or lead zirconate titanate (LZT), and a metal layer, for example, aluminum or any other metal or conductive metal alloy, have been successively deposited. The piezoelectric and metal layers for example have the same thickness. According to a first variation, an etching is performed to define, from the metal layer, the piezoelectric layer and layer 27 of FIG. 3, piezoelectric layer portion 15, thin metal layer portion 17, and metal layer portion 19.

At the step illustrated in FIG. 5A, substrate 25 has been etched from the rear surface (that is, the surface having layer 29 deposited thereon) to form a cavity 31 facing the bi-stable strip. Hereafter, dimensions taken along the horizontal axis of FIGS. 5A and 5B will be called "lengths", and dimensions taken along the vertical axis of FIG. 5B will be called "widths". The cavity length is smaller than the strip length so that the strip bears with its ends on substrate 25. As illustrated in FIG. 5B, cavity 31 is wider than the strip so that the strip sides are clear. Layer portions 15, 17, and 19 of strip 13 have the same length and layer portions 15 and 19 have the same width.

Figure 6A:
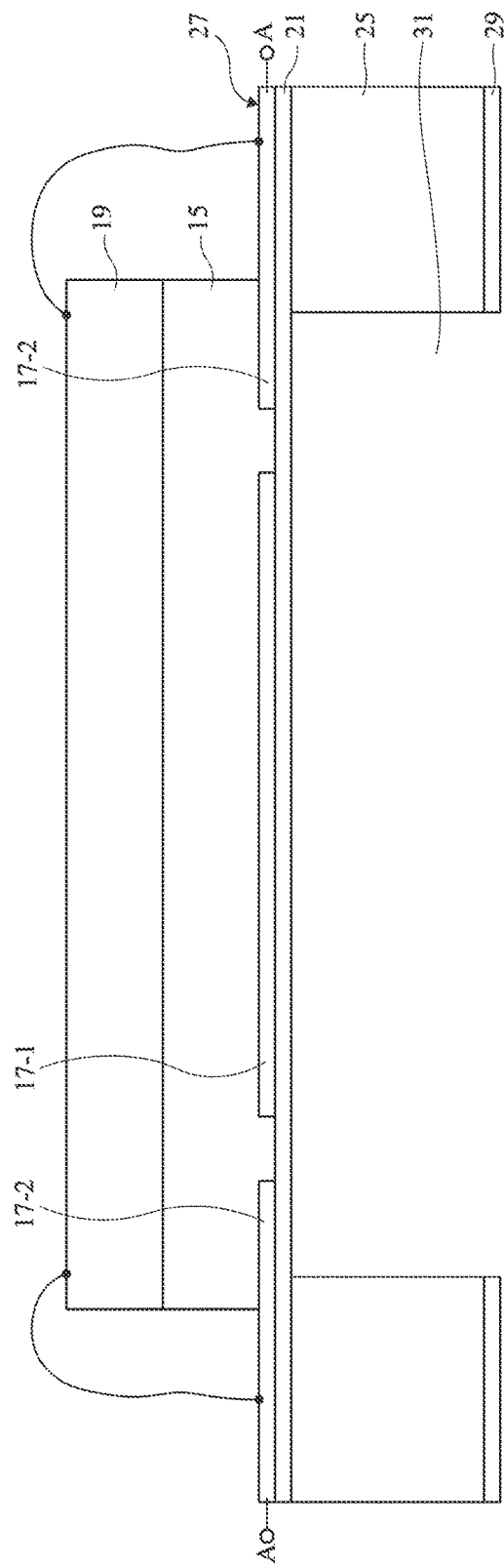
FIG. 6A is a cross-section view of an example of a strip having contacting areas.
Figure 6B:
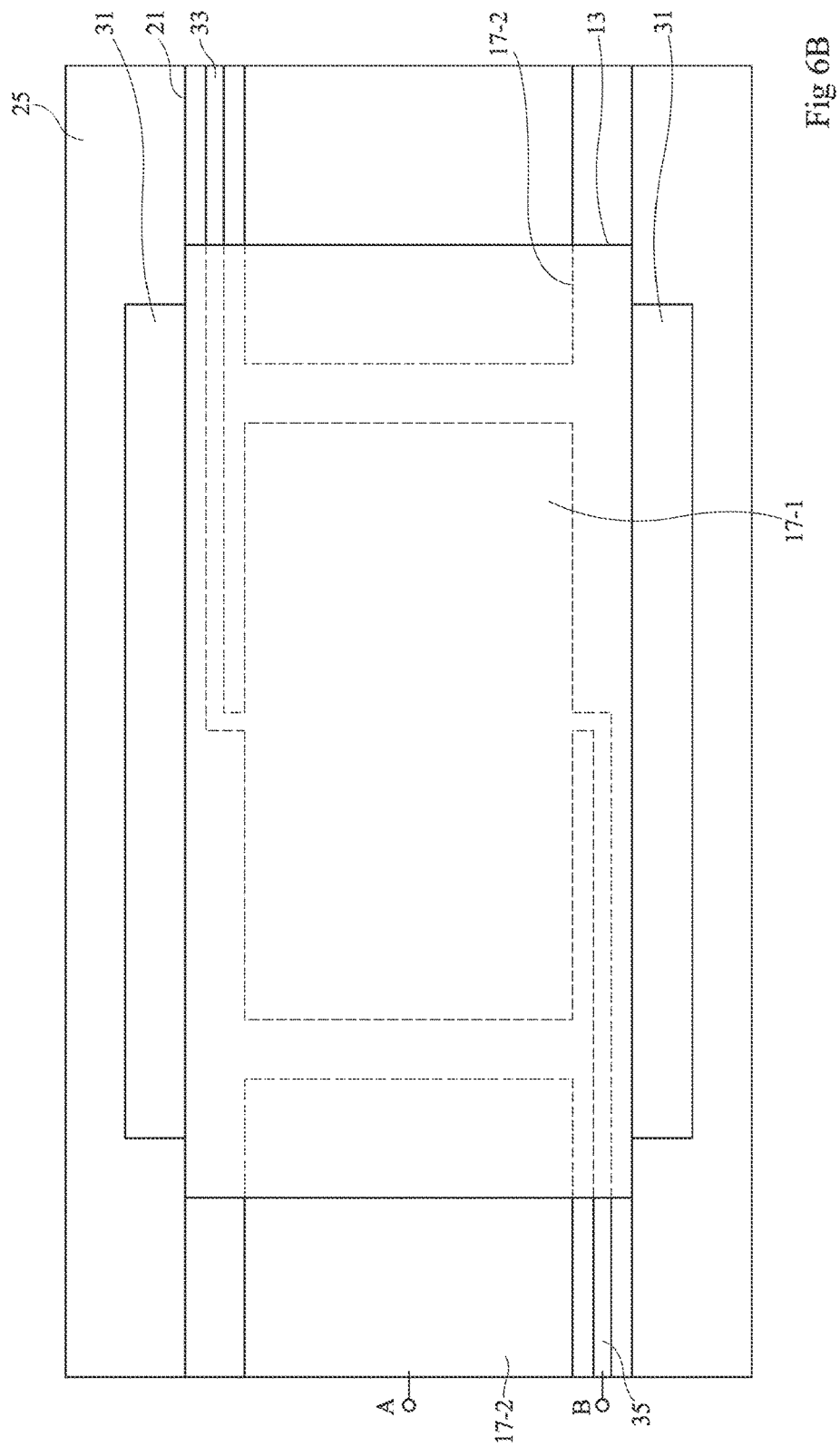
FIG. 6B is a top view of FIG. 6A.

FIGS. 6A and 6B illustrate a connection mode, respectively in cross-section view and in top view, of a bistable strip 13 such as that in FIGS. 5A and 5B.

As illustrated in FIG. 6A, layer 27 has been etched before the deposition of layers 15 and 19, and is divided into one layer portion 17-1 and two layers portions 17-2. Layer portion 17-1 is centered under layer 15, which totally covers layer portion 17-1 and partially covers layer portions 17-2. Terminal A of FIGS. 2A and 2B is connected to the layer portion 17-2 which is connected to layer 19, for example, by a wire.

As illustrated in FIG. 6B, tracks 33 and 35 have been formed by etching of layer 27 before the deposition of layers 15 and 19. Tracks 33 and 35 extend in the lengthwise direction of layer portions 17-1 and 17-2 and contact the middle of the corresponding sides of layer portion 17-1. Terminal B of FIGS. 2A and 2B is connected to tracks 33 and 35.

Strips containing portions of layers of materials having different strains are desired to be obtained, as discussed in the description of FIG. 2A. To achieve this, a plasma spray system is used. This system comprises a pulsed DC generator capable of generating pulses of a given biasing at a frequency from 5 to 350 kHz, a radiofrequency generator (RF) and, in a vacuum chamber, a substrate holder and a target. The target contains at least one element of the material to be deposited on substrate 25, placed on the substrate holder. A plasma is created in the vicinity of the target by the pulsed DC generator. The pulse generator enables to propel plasma elements onto the target to spray particles of the target, which deposit on substrate 25, possibly after combination with plasma elements. It is here provided, on deposition of each of the layers, to control at least one of the following parameters: RF power applied to the substrate, power and frequency of the pulsed DC generator, temperature and/or biasing of the substrate holder. It is thus possible to impose a determined strain to each of the deposited layers, which strain may be modified by varying one and/or the other of the above-mentioned parameters.

Layer portions 15, 17, 19 and layer portion 21 are deposited while controlling their deposition conditions. For example, layer portion 21 is deposited with a high compressive strain, layer portion 17 is deposited with a strain close to zero, and piezoelectric layer portion 15 and metal layer portion 19 are deposited with equal and opposite strains.

As an example, successive layers may be deposited as follows.

Aluminum nitride layer 21:
  RF power: from 0 to 8 W, for example, 6 W;
  DC power: 1,500 W;
  switching frequency of the pulsed DC generator: from 5 to 50 kHz, for example, 20 kHz;
  substrate holder bias voltage: from 50 to 120 V, for example, 80 V;
  deposition temperature: from 250 to 350° C., for example, 300° C.; and
  thickness: from 10 to 500 nm, for example, 200 nm.

Platinum layer 17:
  DC power: 1,000 W;
  deposition temperature: from 300 to 400° C., for example, 350° C.; and
  thickness: from 10 to 500 nm, for example, 100 nm.

Aluminum nitride layer 15:
  RF power: from 0 to 8 W, for example, 6 W;
  DC power: 1,500 W;
  substrate holder bias voltage: from 50 to 120 V, for example, 80 V;
  deposition temperature: from 250 to 350° C., for example, 300° C.; and
  thickness: from 1 to 10 μm, for example, 5 μm.

Aluminum layer 19:
  DC power: 2,000 W;
  deposition temperature: from 250 to 400° C., for example, 330° C.; and
  thickness: from 1 to 10 μm, for example, 5 μm.

In the case of this example, layer 21 has a compressive strain of 1 GPa, the platinum layer has a strain close to zero, the aluminum nitride layer has a 150-MPa compressive strain, and the aluminum layer has a 150-MPa tensile strain. Further, the platinum layer is etched to provide metal layer portion 17, the aluminum nitride layer is etched to provide piezoelectric layer portion 15, and the aluminum layer is etched to provide metal layer portion 19.

In the specific embodiment described herein, the assembly of layers 15, 17, 19 has a strain close to zero and layer portion 21 has a high strain. Another strain distribution in the various strip layers may also be provided. For example, bistable strip 13 may be manufactured so that layers 17 and 21 have a strain close to zero, layer 15 has a high compressive strain, and layer 19 has a low tensile strain which does not compensate for the compressive strain of layer 15.

Although this has not been shown in FIG. 5A, the strip is released and deforms under the effect of the compressive strain existing in layer portion 21. The strip then takes the shape of the strip illustrated in FIG. 2B. A bistable strip 13 with an initial curvature having its curvature depending on the strain, and thus on the conditions of deposition of layer portion 21, is thus obtained.

An advantage of such a method is that the number of manufacturing steps of a bistable strip having an initial curvature is decreased since the parameters causing the strip curvature are adjusted during the deposition of the layer portions.

Another advantage of such a method is that using, for layer portion 21, a material containing at least one element of the materials of layers 15, 17, and/or 19 avoids manipulations of the spraying system on deposition of the layers of materials.

A method of forming a specific bistable piezoelectric strip comprising an assembly of three layers (metal, piezoelectric, metal) capable of forming a piezoelectric strip having a zero general strain and an additional layer added in conditions capable of giving the strip a determined curvature has here been described.

More generally, the present disclosure applies to the deposition of a bistable strip comprising at least two layers, one of which may be piezoelectric or pyroelectric, the layers being deposited in conditions capable of creating strain therein so that the general strain is non-zero and the strip bends.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
manufacturing a first bistable strip having a first curvature, wherein manufacturing the first bistable strip includes forming a first plurality of layers including a first layer of a first material, wherein forming the first layer includes depositing the first layer in a vacuum chamber by plasma spraying using a plasma spray system having a first set of deposition conditions that causes the first curvature; and
manufacturing a second bistable strip having a second curvature different from the first curvature, wherein manufacturing the second bistable strip includes forming a second plurality of layers including a second layer of the first material, wherein forming the second layer includes depositing the second layer in the vacuum chamber by plasma spraying using the plasma spray system having a second set of deposition conditions that causes the second curvature, the second set of deposition conditions being different from the first set of deposition conditions.

2. The method of claim 1, wherein the first [and second] plurality of layers includes:
a first layer of a second conductive material;
a first layer of a third piezoelectric material; and
a first layer of a fourth conductive material; and
wherein the second plurality of layers includes:
a second layer of the second conductive material;
a second layer of the third piezoelectric material; and
a second layer of the fourth conductive material.

3. The method of claim 2, wherein the first material and the third piezoelectric material are identical.

4. The method of claim 3, wherein the first and second layers of the first material each have a thickness in a range from 10 to 500 nm, the first and second layers of the second conductive material each have a thickness in a range from 10 to 500 nm, the first and second layers of the third piezoelectric material each have thicknesses in a range from 1 to 10 µm, and the first and second layers of the fourth conductive material each have thicknesses in a range from 1 to 10 µm.

5. The method of claim 2, wherein the first material and the third piezoelectric material are aluminum nitride, the second conductive material is platinum, and the fourth conductive material is aluminum.

6. The method of claim 2, wherein the first and second layers of the second conductive material each have a strain close to zero, the first layers of the third piezoelectric material and the fourth conductive material each have equal and opposite strains; and the second layers of the third piezoelectric material and the fourth conductive material each have equal and opposite strains.

7. The method of claim 1, wherein forming the first plurality of layers comprises forming the first plurality of layers on a silicon wafer.

8. A method, comprising:
manufacturing a first bistable strip having a first curvature, wherein manufacturing the first bistable strip includes forming a first plurality of layers including a first layer, wherein forming the first layer includes depositing the first layer in a vacuum chamber by plasma spraying using a plasma spray system having a first set of deposition conditions that causes the first curvature; and
manufacturing a second bistable strip having a second curvature different from the first curvature, wherein manufacturing the second bistable strip includes forming a second plurality of layers including a second layer, wherein forming the second layer includes depositing the second layer in the vacuum chamber by plasma spraying using the plasma spray system having a second set of deposition conditions that causes the second curvature, the second set of deposition conditions being different from the first set of deposition conditions.

9. The method of claim 8, wherein the first and the second sets of conditions include at least one of: applied RF power, power and frequency of a pulsed DC generator, temperature, and biasing of a substrate holder.

* * * * *

UNITED STATES PATENT AND TRADEMARK OFFICE
CERTIFICATE OF CORRECTION

| | |
|---|---|
| PATENT NO. | : 10,312,431 B2 |
| APPLICATION NO. | : 14/634454 |
| DATED | : June 4, 2019 |
| INVENTOR(S) | : Emilie Trioux et al. |

Page 1 of 1

It is certified that error appears in the above-identified patent and that said Letters Patent is hereby corrected as shown below:

In the Claims

Column 6, Line 4:
"The method of claim 1, wherein the first [and second]" should read, -- The method of claim 1, wherein the first --

Signed and Sealed this
Seventeenth Day of September, 2019

Andrei Iancu
*Director of the United States Patent and Trademark Office*